United States Patent
Zheng et al.

(10) Patent No.: US 10,634,751 B2
(45) Date of Patent: Apr. 28, 2020

(54) SYSTEMS AND METHODS FOR REDUCING ARTIFACTS IN MRI IMAGES

(71) Applicant: UIH AMERICA, INC., Houston, TX (US)

(72) Inventors: Yuan Zheng, Houston, TX (US); Jinbo Ma, Shanghai (CN); Yu Ding, Houston, TX (US); Qing Wei, Shanghai (CN); Zhenhua Shen, Shanghai (CN)

(73) Assignee: UIH AMERICA, INC., Houston, TX (US)

( * ) Notice: Subject to any disclaimer, the term of this patent is extended or adjusted under 35 U.S.C. 154(b) by 115 days.

(21) Appl. No.: 15/721,840

(22) Filed: Sep. 30, 2017

(65) Prior Publication Data

US 2019/0101608 A1    Apr. 4, 2019

(51) Int. Cl.
| | | |
|---|---|---|
| G01R 33/561 | (2006.01) | |
| G01R 33/36 | (2006.01) | |
| G01R 33/54 | (2006.01) | |
| G01R 33/483 | (2006.01) | |
| G01R 33/565 | (2006.01) | |

(52) U.S. Cl.
CPC ..... *G01R 33/5617* (2013.01); *G01R 33/3614* (2013.01); *G01R 33/4833* (2013.01); *G01R 33/4835* (2013.01); *G01R 33/543* (2013.01); *G01R 33/5659* (2013.01); G01R 33/3607 (2013.01)

(58) Field of Classification Search
None
See application file for complete search history.

(56) References Cited

U.S. PATENT DOCUMENTS

| | | | | |
|---|---|---|---|---|
| 6,888,348 | B2 * | 5/2005 | Kupce | G01R 33/46 324/307 |
| 8,405,395 | B2 | 3/2013 | Setsompop et al. | |
| 8,604,786 | B2 | 12/2013 | Stemmer | |
| 8,994,373 | B2 | 3/2015 | Stemmer | |
| 2013/0043867 | A1 * | 2/2013 | Corum | G01R 33/4616 324/309 |
| 2017/0276751 | A1 * | 9/2017 | Xie | G01R 33/4835 |
| 2018/0017653 | A1 * | 1/2018 | Chen | G01R 33/4835 |

OTHER PUBLICATIONS

M Barth et al. Simultaneous multislice (SMS) imaging techniques, Magnetic Resonance in Medicine, 2016, 19 pages.

* cited by examiner

*Primary Examiner* — Douglas X Rodriguez
(74) *Attorney, Agent, or Firm* — METIS IP LLC

(57) ABSTRACT

A method for modifying RF pulse infidelity is provided. The method may include obtaining a designed time-domain waveform. The method may also include directing a radio frequency power amplifier (RFPA) of a magnetic resonance imaging (MRI) scanner to generate an output RF pulse based on the designed time-domain waveform. The method may also include measuring an output time-domain waveform of the output RF pulse. The method may also include determining, based on the designed time-domain waveform and the output time-domain waveform, a modified time-domain waveform corresponding to an excitation RF pulse. The method may also include directing the MRI scanner to generate, using a waveform generator and the RFPA and based on the modified time-domain waveform, the excitation RF pulse to excite one or more slices of an object in an MRI scan.

16 Claims, 11 Drawing Sheets

SYSTEMS AND METHODS FOR REDUCING ARTIFACTS IN MRI IMAGES

TECHNICAL FIELD

The present disclosure generally relates to magnetic resonance imaging (MRI), and more specifically relates to systems and methods for modifying radiofrequency (RF) pulses used in an MRI scan.

BACKGROUND

Magnetic resonance imaging (MRI) is widely used for medical diagnosis. During an MRI scan, there may be one or more excitations in each of which one or more slices of an object may be excited. In an excitation, an excitation RF pulse may be applied to excite one or more slices of the object in conjunction with a slice selective gradient. Generally, a waveform generator of an MRI scanner may generate an RF pulse. The RF pulse generated by the waveform generator may be amplified using a radiofrequency power amplifier (RFPA). The RFPA may amplify the RF pulse (e.g., the power of the RF pulse, the voltage of the RF pulse) such that the amplified RF pulse may drive the RF coils to generate a magnetic field of a sufficient magnitude. However, the waveform of the amplified RF pulse generated by the RFPA may be different from designed, which is referred to as distortion. When the amplified RF pulse with distortion is applied on the RF coils to generate a magnetic field, the magnetic field together with a slice selective gradient may excite one or more undesired slices, which may cause artifacts in an image generated based on the MRI scan. Therefore, it is desirable to provide systems and methods to reduce or eliminate the effect of the distortion.

SUMMARY

In a first aspect of the present disclosure, a system for modifying RF pulse infidelity may one or more storage devices and one or more processors configured to communicate with the one or more storage devices. The one or more storage devices may include a set of instructions. When the one or more processors executing the set of instructions, the one or more processors may be directed to perform one or more of the following operations. The one or more processors may obtain a designed time-domain waveform. The one or more processors may direct a radio frequency power amplifier (RFPA) of a magnetic resonance imaging (MRI) scanner to generate an output RF pulse based on the designed time-domain waveform. The one or more processors may measure an output time-domain waveform of the output RF pulse. The one or more processors may determine, based on the designed time-domain waveform and the output time-domain waveform, a modified time-domain waveform corresponding to an excitation RF pulse. The one or more processors may direct the MRI scanner to generate, using a waveform generator and the RFPA and based on the modified time-domain waveform, the excitation RF pulse to excite one or more slices of an object in an MRI scan.

In some embodiments, the modified time-domain waveform is closer to satisfying an execution capability criterion than the designed time-domain waveform. The execution capability criterion may embody a criterion for a refocusing flip angle of the designed RF pulse.

In some embodiments, to determine the modified time-domain waveform corresponding to the excitation RF pulse based on the designed time-domain waveform and the output time-domain waveform, the one or more processors may transform the designed time-domain waveform into a designed frequency-domain waveform with one or more excitation bands. The one or more processors may transform the output time-domain waveform into an output frequency-domain waveform. The one or more processors may determine one or more frequency-domain sidebands in the output frequency-domain waveform by comparing the designed frequency-domain waveform with the output frequency-domain waveform. The one or more processors may determine the modified time-domain waveform based on the one or more frequency-domain sidebands.

In some embodiments, to determine the modified time-domain waveform based on the one or more frequency-domain sidebands, the one or more processors may select a portion of the output frequency-domain waveform, the portion of the output frequency-domain waveform including the one or more frequency-domain sidebands but not the one or more excitation bands. The one or more processors may determine a compensation frequency-domain waveform based on the selected portion of the output frequency-domain waveform. The one or more processors may transform the compensation frequency-domain waveform into a compensation time-domain waveform. The one or more processors may determine the modified time-domain waveform based on the compensation time-domain waveform and the designed time-domain waveform.

In some embodiments, a phase difference between the selected portion of the output frequency-domain waveform and the compensation frequency-domain waveform may be 180°.

In some embodiments, to determine the modified time-domain waveform corresponding to the excitation RF pulse, the one or more processors may repeatedly determine an updated time-domain waveform in an iteration process including a plurality of successive iterations until a termination criterion is satisfied. The updated time-domain waveform determined at the end of the iteration process may be the modified time-domain waveform.

In some embodiments, at least one of the plurality of iterations may include determining the updated time-domain waveform based on the designed time-domain waveform and a previous output time-domain waveform. The previous output time-domain waveform may correspond to the designed time-domain waveform in a first iteration of the interation process or a previously updated time-domain waveform determined in a previous iteration. The updated time-domain waveform may correspond to an updated RF pulse. The at least one of the plurality of iterations may also include directing the RFPA of the MRI scanner to generate the updated RF pulse. The at least one of the plurality of iterations may also include measuring an output time-domain waveform of the updated RF pulse.

In some embodiments, at least one of the plurality of iterations may further include determining an iteration count of iterations that have been performed. The at least one of the plurality of iterations may further include determining that the iteration count is equal to or greater than a first threshold. The at least one of the plurality of iterations may further include terminating, based on the determination that the iteration count is equal to or greater than the first threshold, the iteration process.

In some embodiments, at least one of the plurality of iterations may further include displaying, to a user, a frequency-domain waveform of an RF pulse generated by the RFPA based on the modified time-domain waveform updated in the at least one of the plurality of iterations. The at least one of the plurality of iterations may further include receiving, from the user, an instruction related to the updated time-domain waveform determined in the at least one of the plurality of iterations. The at least one of the plurality of iterations may further include terminating, based on the received instruction, the iteration process.

In some embodiments, the received instruction includes that the updated RF pulse generated by the RFPA based on the updated time-domain waveform generated in the at least one of the plurality of iterations is acceptable.

In some embodiments, the excitation RF pulse may be applied to simultaneous multi-slice (SMS) imaging.

According to another aspect of the present disclosure, a method for modifying RF pulse infidelity may include one or more of the following operations. One or more processors may obtain a designed time-domain waveform. The one or more processors may direct a radio frequency power amplifier (RFPA) of a magnetic resonance imaging (MRI) scanner to generate an output RF pulse based on the designed time-domain waveform. The one or more processors may measure an output time-domain waveform of the output RF pulse. The one or more processors may determine, based on the designed time-domain waveform and the output time-domain waveform, a modified time-domain waveform corresponding to an excitation RF pulse. The one or more processors may direct the MRI scanner to generate, using a waveform generator and the RFPA and based on the modified time-domain waveform, the excitation RF pulse to excite one or more slices of an object in an MRI scan.

According to yet another aspect of the present disclosure, a non-transitory computer readable medium may comprise at least one set of instructions. The at least one set of instructions may be executed by one or more processors of a computing device. The one or more processors may obtain a designed time-domain waveform. The one or more processors may direct a radio frequency power amplifier (RFPA) of a magnetic resonance imaging (MRI) scanner to generate an output RF pulse based on the designed time-domain waveform. The one or more processors may measure an output time-domain waveform of the output RF pulse. The one or more processors may determine, based on the designed time-domain waveform and the output time-domain waveform, a modified time-domain waveform corresponding to an excitation RF pulse. The one or more processors may direct the MRI scanner to generate, using a waveform generator and the RFPA and based on the modified time-domain waveform, the excitation RF pulse to excite one or more slices of an object in an MRI scan.

According to yet another aspect of the present disclosure, a system for modifying RF pulse infidelity may comprise: a waveform design module configured to obtain a designed time-domain waveform; a control module configured to direct a radio frequency power amplifier (RFPA) of a magnetic resonance imaging (MRI) scanner to generate an output RF pulse based on the designed time-domain waveform; an output pulse acquisition module configured to measure an output time-domain waveform of the output RF pulse; a waveform modification module configured to determine, based on the designed time-domain waveform and the output time-domain waveform, a modified time-domain waveform corresponding to an excitation RF pulse; and the control module configured to direct the MRI scanner to generate, using a waveform generator and the RFPA and based on the modified time-domain waveform, the excitation RF pulse to excite one or more slices of an object in an MRI scan.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

Figure 3:
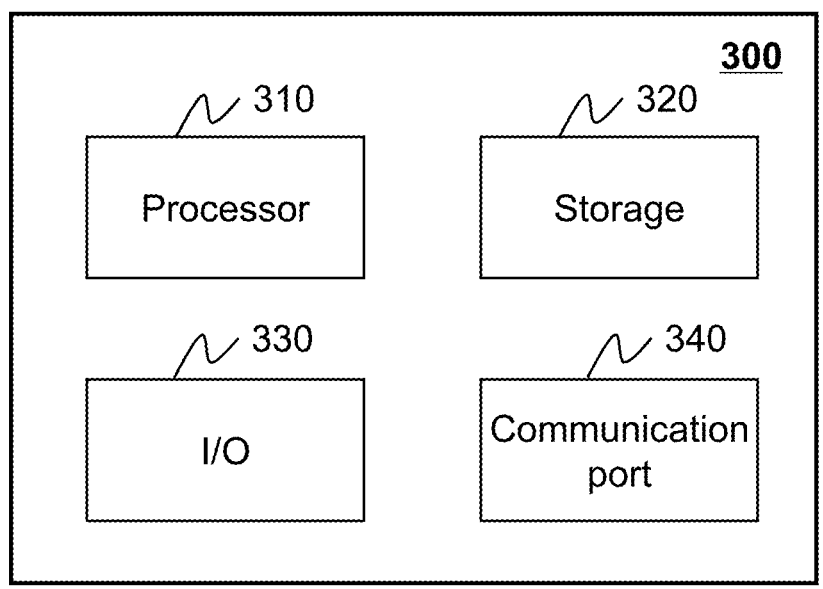
FIG. 3 is a schematic diagram illustrating exemplary hardware and/or software components of a computing device on which a processing device may be implemented according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or other storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 310 as illustrated in FIG. 3) may be provided on a computer readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included of connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

An aspect of the present disclosure relates to systems and methods for modifying a time-domain waveform relating to an excitation RF pulse to compensate undesired sidebands in an amplified RF pulse generated by RFPA. During an MRI scan, an MRI scanner may generate an RF pulse from the modified time-domain waveform to excite the one or more slices of the object in conjunction with a slice selective gradient.

The following description is provided with reference to systems and methods for modifying an excitation RF pulse. This is not intended to limit the scope the present disclosure. For persons having ordinary skills in the art, a certain amount of variations, changes, and/or modifications may be deducted under the guidance of the present disclosure. Those variations, changes, and/or modifications do not depart from the scope of the present disclosure.

During an MRI scan, there may be one or more excitations in each of which one or more slices of an object may be excited. In an excitation, an excitation RF pulse may be applied to excite one or more slices of the object in conjunction with a slice selective gradient. The excitation RF pulse and the slice selective gradient may collaboratively determine which slice(s) of the object is/are excited. In some embodiments, the systems and/or methods described in this disclosure may be applied to single slice MR imaging and/or multi-slice MR imaging (e.g., simultaneous multi-slice (SMS) imaging). In the single slice MR imaging, one slice may be excited at a time during the MRI scan. In the multi-slice MR imaging, more than one slice may be excited at a time during the MRI scan. In SMS imaging, more than one slice may be excited simultaneously in one excitation.

Figure 1:
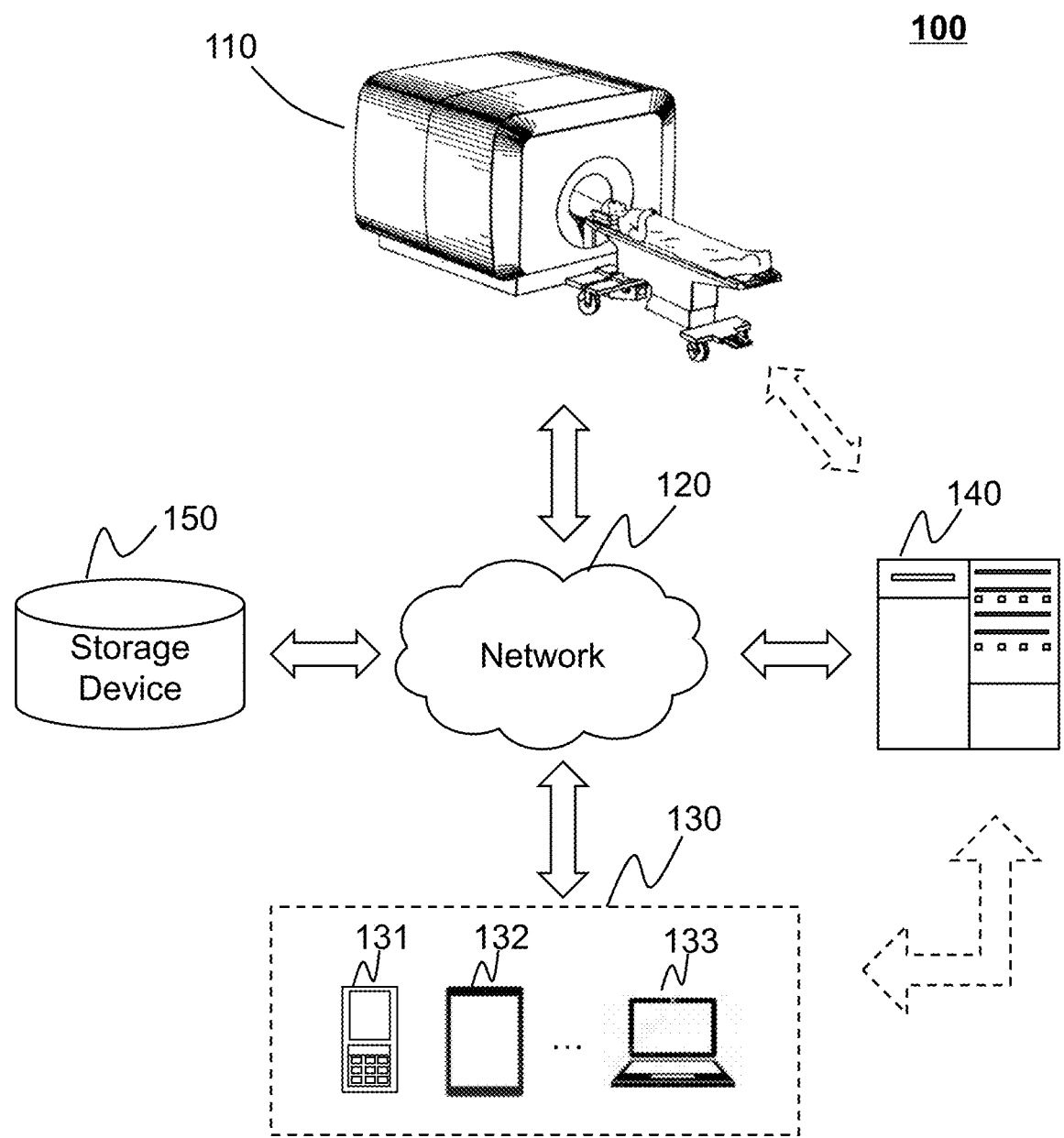
FIG. 1 is a schematic diagram illustrating an exemplary MRI system according to some embodiments of the present disclosure.

FIG. 1 is a schematic diagram illustrating an exemplary MRI system 100 according to some embodiments of the present disclosure. As illustrated, the MRI system 100 may include an MRI scanner 110, a network 120, a terminal 130, a processing device 140, and a storage device 150. The components of the MRI system 100 may be connected in one or more of various ways. Mere by way of example, as illustrated in FIG. 1, the MRI scanner 110 may be connected to the processing device 140 through the network 120. As another example, the MRI scanner 110 may be connected to the processing device 140 directly (as indicated by the bi-directional arrow in dotted lines linking the MRI scanner 110 and the processing device 140). As a further example, the storage device 150 may be connected to the processing device 140 directly or through the network 120. As still a further example, a terminal device (e.g., 130-1, 130-2, 130-3, etc.) may be connected to the processing device 140 directly (as indicated by the bi-directional arrow in dotted lines linking the terminal 130 and the processing device 140) or through the network 120.

The MRI scanner 110 may scan an object located within its detection region and generate a plurality of data relating to the object. In the present disclosure, "subject" and "object" are used interchangeably. Mere by way of example, the object may include a patient, a man-made object, etc. As another example, the object may include a specific portion, organ, and/or tissue of the patient. For example, the object may include head, brain, neck, body, shoulder, arm, thorax, cardiac, stomach, blood vessel, soft tissue, knee, feet, or the like, or any combination thereof. In some embodiments, the MRI scanner 110 may be a close-bore scanner or an open-bore scanner. More description of the MRI scanner 110 may be found elsewhere in the present disclosure. See, e.g., FIG. 2 and the description thereof.

The network 120 may include any suitable network that can facilitate the exchange of information and/or data for the MRI system 100. In some embodiments, one or more components of the MRI system 100 (e.g., the MRI scanner 110, the terminal 130, the processing device 140, or the storage device 150) may communicate information and/or data with one or more other components of the MRI system 100 via the network 120. For example, the processing device 140 may obtain signals of an RF pulse from the MRI scanner 110 via the network 120. In some embodiments, the network 120 may be any type of wired or wireless network, or a combination thereof. The network 120 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the MRI system 100 may be connected to the network 120 to exchange data and/or information.

The terminal 130 include a mobile device 130-1, a tablet computer 130-2, a laptop computer 130-3, or the like, or any combination thereof. In some embodiments, the mobile device 130-1 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smart watch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google™ Glass, an Oculus Rift, a Hololens, a Gear VR, etc. In some embodiments, the terminal 130 may remotely operate the MRI scanner 110. In some embodiments, the terminal 130 may operate the MRI scanner 110 via a wireless connection. In some embodiments, the terminal 130 may receive information and/or instructions inputted by a user, and send the received information and/or instructions to the MRI scanner 110 or to the processing device 140 via the network 120. In some embodiments, the terminal 130 may receive data and/or information from the processing device 140. In some embodiments, the terminal 130 may be part of the processing device 140. In some embodiments, the terminal 130 may be omitted.

The processing device 140 may process data and/or information obtained from the MRI scanner 110, the terminal 130, and/or the storage device 150. For example, the processing device 140 may obtain a designed time-domain waveform from the storage device 150 and correct the designed time-domain waveform. In some embodiments, the processing device 140 may be a single server, or a server group. The server group may be centralized, or distributed. In some embodiments, the processing device 140 may be local or remote. For example, the processing device 140 may access information and/or data stored in the MRI scanner 110, the terminal 130, and/or the storage device 150 via the network 120. As another example, the processing device 140 may be directly connected to the MRI scanner 110, the terminal 130, and/or the storage device 150 to access stored information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 140 may be implemented on a computing device 300 having one or more components illustrated in FIG. 3 in the present disclosure.

The storage device 150 may store data and/or instructions. In some embodiments, the storage device 150 may store data obtained from the terminal 130 and/or the processing device 140. For example, the storage device 150 may store a designed time-domain waveform designed by a user (e.g., a doctor, an imaging engineer). In some embodiments, the storage device 150 may store data and/or instructions that the processing device 140 may execute or use to perform exemplary methods described in the present disclosure. For example, the storage device 150 may store instructions that the processing device 140 may execute or use to determine a modified time-domain waveform. In some embodiments, the storage device 150 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components of the MRI system 100 (e.g., the processing device 140, the terminal 130, etc.). One or more components of the MRI system 100 may access the data or instructions stored in the storage device 150 via the network 120. In some embodiments, the storage device 150 may be directly connected to or communicate with one or more components of the MRI system 100 (e.g., the processing device 140, the terminal 130, etc.). In some embodiments, the storage device 150 may be part of the processing device 140.

Figure 2:
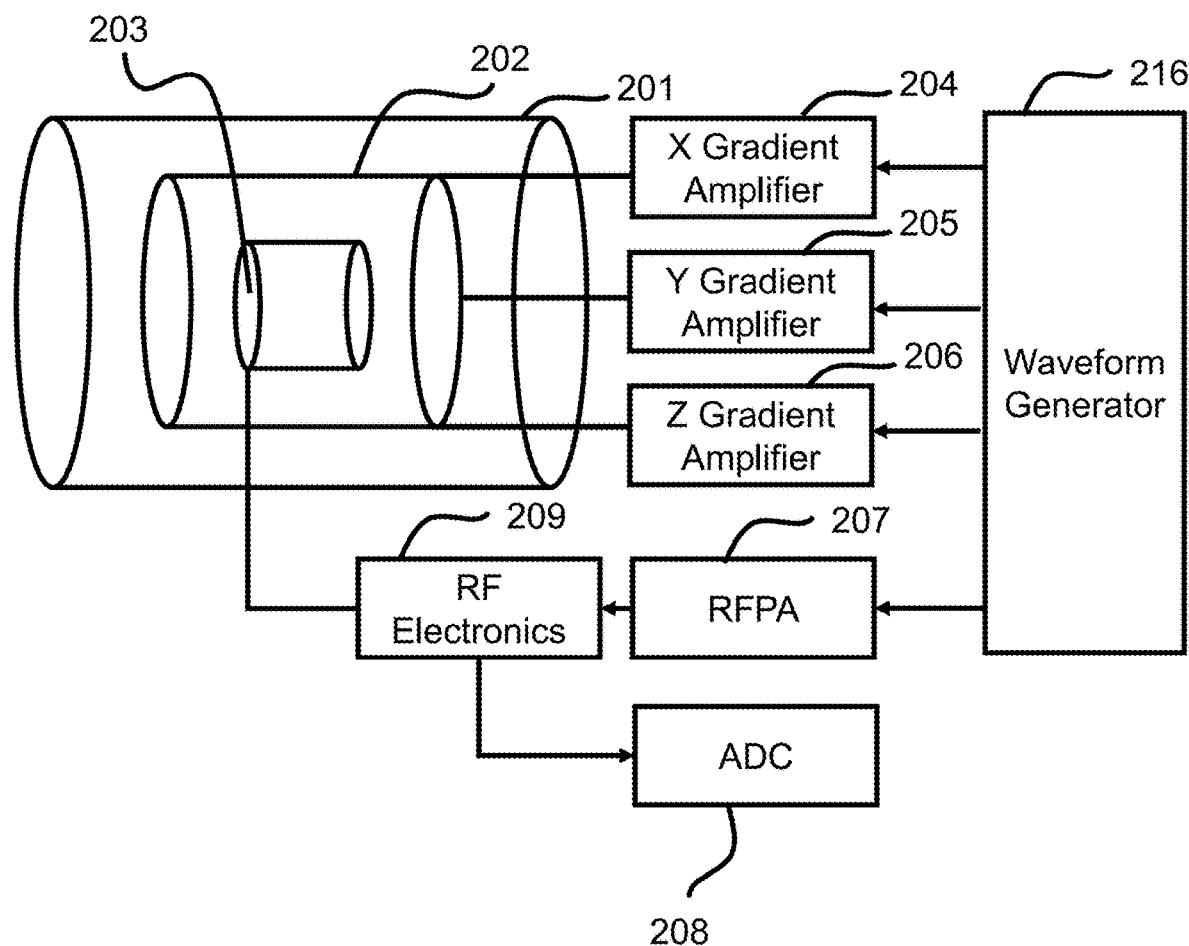
FIG. 2 is a schematic diagram illustrating an exemplary MRI scanner according to some embodiments of the present disclosure.

FIG. 2 is a schematic diagram illustrating an exemplary MRI scanner according to some embodiments of the present disclosure. As illustrated, the main magnet 201 may generate a first magnetic field (or referred to as a main magnetic field) that may be applied to an object (also referred to as a subject) exposed inside the field. The main magnet 201 may also control the homogeneity of the generated main magnetic field. Some shim coils may be in the main magnet 201. The shim coils placed in the gap of the main magnet 201 may compensate for the inhomogeneity of the magnetic field of the main magnet 201. Gradient coils 202 may be located inside the main magnet 201. The gradient coils 202 may generate a second magnetic field (or referred to as a gradient field). The gradient coils 202 may distort the main field generated by the main magnet 201 so that the magnetic orientations of the protons of an object may vary as a function of their positions inside the gradient field. The gradient coils 202 may include X coils, Y coils, and/or Z coils (not shown in FIG. 2). In some embodiments, the Z coils may be designed based on circular (Maxwell) coils, while the X coils and the Y coils may be designed on the basis of the saddle (Golay) coil configuration. The three sets of coils may generate three different magnetic fields that are used for position encoding. The gradient coils 202 may allow spatial encoding of MR signals for image construction. The gradient coils 202 may be connected with one or more of an X gradient amplifier 204, a Y gradient amplifier 205, or a Z gradient amplifier 206. One or more of the three amplifiers may be connected to a waveform generator 216. The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coils 202 to generate a magnetic field in the X-axis, the Y-axis, or the Z-axis, respectively. The gradient coils 202 may be designed for either a close-bore MRI scanner or an open-bore MRI scanner. In some instances, all three sets of coils of the gradient coils 202 may be energized and three gradient fields may be generated thereby. In some embodiments of the present disclosure, the X coils and Y coils may be energized to generate the gradient fields in the X direction and the Y direction.

In some embodiments, RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208.

The RF coils 203 may serve as transmitters, receivers, or both. When used as transmitters, the RF coils 203 may generate a third magnetic field that is utilized to generate MR signals for image generation. The third magnetic field may be perpendicular to the main magnetic field. The waveform generator 216 may generate an RF pulse. The RF pulse may be amplified by the RFPA 207, processed by the RF electronics 209, and applied to the RF coils 203 to generate a third magnetic field in response to a powerful current generated by the RF electronics 209 based on the amplified RF pulse. When used as receivers, the RF coils may be responsible for detecting MR signals (e.g., echoes).

In some embodiments, the RFPA 207 may amplify an RF pulse (e.g., the power of the RF pulse, the voltage of the RF pulse) such that an amplified RF pulse is generated to drive the RF-coils 203. The RFPA 207 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 207 may include a linear RFPA, or a nonlinear RFPA. In some embodiments, the RFPA 207 may include one or more RFPAs.

FIG. 3 is a schematic diagram illustrating exemplary hardware and/or software components of a computing device on which the processing device 140 may be implemented according to some embodiments of the present disclosure. As illustrated in FIG. 3, the computing device 300 may include a processor 310, a storage 320, an input/output (I/O) 330, and a communication port 340.

The processor 310 may execute computer instructions (program code) and perform functions of the processing device 140 in accordance with techniques described herein. The computer instructions may include routines, programs, objects, components, signals, data structures, procedures, modules, and functions, which perform particular functions described herein. For example, the processor 310 may obtain a designed time-domain waveform from the storage device 150 and correct the designed time-domain waveform. In some embodiments, the processor 310 may include a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration purposes, only one processor is described in the computing device 300. However, it should be note that the computing device 300 in the present disclosure may also include multiple processors, thus operations and/or method steps that are performed by one processor as described in the present disclosure may also be jointly or separately performed by the multiple processors. For example, if in the present disclosure the processor of the computing device 300 executes both step A and step B, it should be understood that step A and step B may also be performed by two different processors jointly or separately in the computing device 300 (e.g., a first processor executes step A and a second processor executes step B, or the first and second processors jointly execute steps A and B).

The storage 320 may store data/information obtained from the MRI scanner 110, the terminal 130, the storage device 150, or any other component of the MRI system 100. In some embodiments, the storage 320 may include a mass storage device, a removable storage device, a volatile read-and-write memory, a read-only memory (ROM), or the like, or any combination thereof. For example, the mass storage device may include a magnetic disk, an optical disk, a solid-state drive, etc. The removable storage device may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 320 may store one or more programs and/or instructions to perform exemplary methods described in the present disclosure. For example, the storage 320 may store a program for the processing device 140 for determining a modified time-domain waveform corresponding to an excitation RF pulse to excite one or more slices of an object in conjunction with a slice selective gradient in an excitation in an MRI scan.

The I/O 330 may input or output signals, data, or information. In some embodiments, the I/O 330 may enable a user interaction with the processing device 140. For example, the processing device may display an image through the I/O 330. In some embodiments, the I/O 330 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 340 may be connected to a network (e.g., the network 120) to facilitate data communications. The communication port 340 may establish connections between the processing device 140 and the MRI scanner 110, the terminal 130, or the storage device 150. The connection may be a wired connection, a wireless connection, or combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 340 may be a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
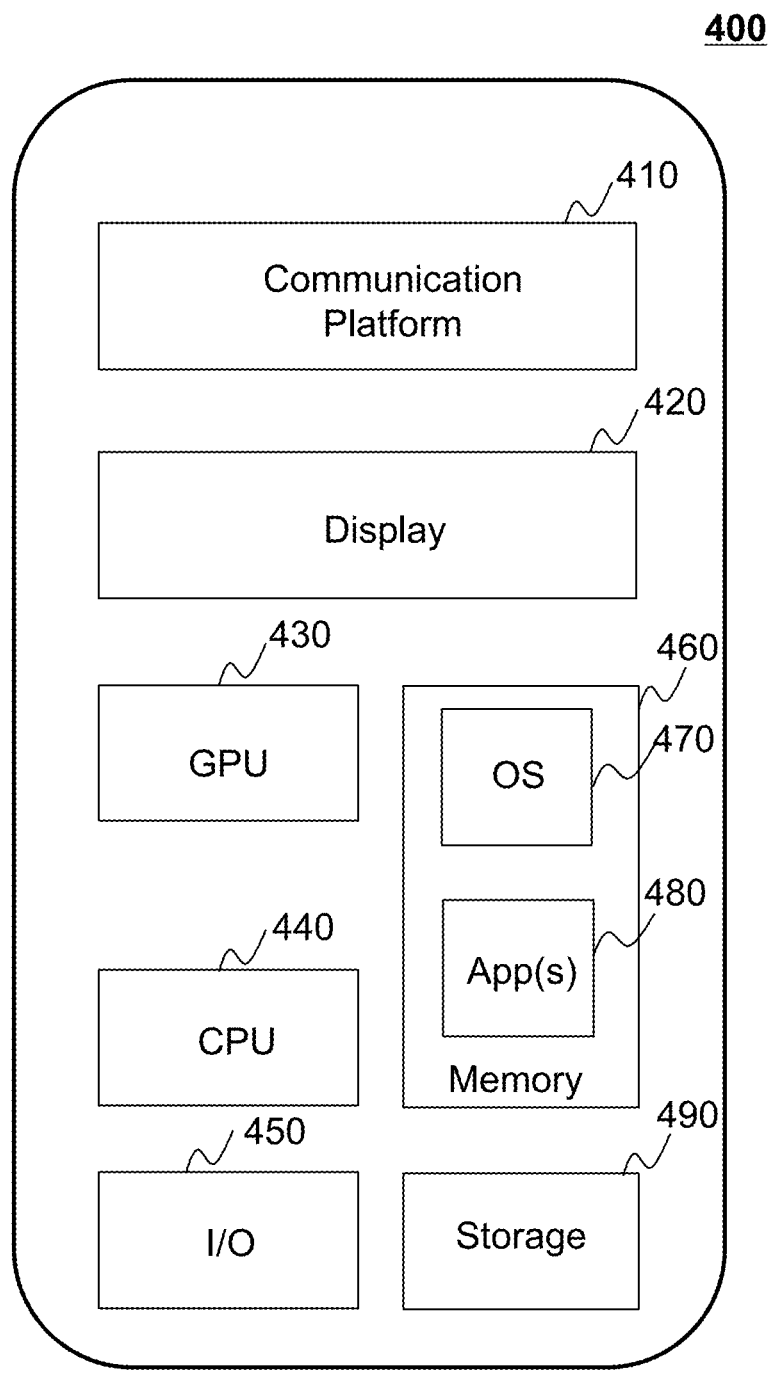
FIG. 4 is a schematic diagram illustrating exemplary hardware and/or software components of a mobile device on which a terminal may be implemented according to some embodiments of the present disclosure.

FIG. 4 is a schematic diagram illustrating exemplary hardware and/or software components of a mobile device on which the terminal 130 may be implemented according to some embodiments of the present disclosure. As illustrated in FIG. 4, the mobile device 400 may include a communication platform 410, a display 420, a graphic processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400. In some embodiments, a mobile operating system 470 (e.g., iOS, Android, Windows Phone, etc.) and one or more applications 480 may be loaded into the memory 460 from the storage 490 in order to be executed by the CPU 440. The applications 480 may include a browser or any other suitable mobile apps for receiving and rendering information relating to image processing or other information from the processing device 140. User interactions with the information stream may be achieved via the I/O 450 and provided to the processing device 140 and/or other components of the MRI system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to the blood pressure monitoring as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result the drawings should be self-explanatory.

Figure 5:
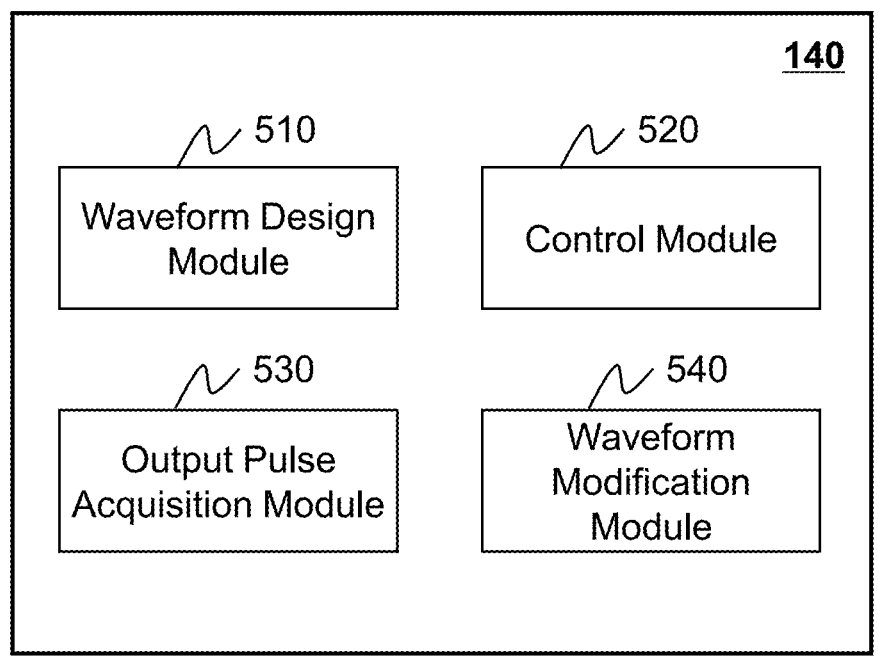
FIG. 5 is a block diagram illustrating an exemplary processing device according to some embodiments of the present disclosure.

FIG. 5 is a block diagram illustrating an exemplary processing device according to some embodiments of the present disclosure. The processing device 140 may be implemented on the computing device 300 (e.g., the processor 310) illustrated in FIG. 3. During an MRI scan, there may be one or more excitations in each of which one or more slices of an object may be excited. In an excitation, an excitation RF pulse may be applied to excite one or more slices of the object in conjunction with a slice selective gradient. The excitation RF pulse and the slice selective gradient may collaboratively determine which slice(s) of the object is/are excited. The slice of the object refers to a cross-section of the object. The cross-section may be parallel to a plane of any direction, such as a transverse plane, a sagittal plane, or a coronal plane of the object.

The processing device 140 may include a waveform design module 510, a control module 520, an output pulse acquisition module 530, and a waveform modification module 540.

The waveform design module 510 may be configured to obtain a designed time-domain waveform. A time-domain waveform may be a scanning sequence indicating a relationship between the time and the magnitude/phase of an RF pulse. The designed time-domain waveform may include a control sequence. The control sequence may be normally defined as a measurement protocol, which has been created in advance and can be retrieved (e.g., from a memory) for a specific measurement. The retrieved protocol can, if necessary, be modified on site by a user (e.g., a doctor, an imaging engineer), who can provide additional control parameters such as, for example, a defined slice interval of a stack of slices to be measured, a slice thickness, etc. The control sequence (also designated as a pulse sequence) is then calculated on the basis of all of these control parameters. The pulse sequence may comprise a value of a flip angle that can be influenced with a refocusing pulse. The value of the flip angle may be within a value range between 90 degrees and 180 degrees. In some embodiments, a user (e.g., a doctor, or an imaging engineer) of the MRI system 100 may input, through an interface of the processing device 140, user specifications including, e.g., one or more parameters regarding a desired time-domain waveform. The waveform design module 510 may obtain a designed time-domain waveform according to the user specifications. The user specifications may include the number of slices of an object to be scanned in an excitation of an MRI scan, the locations of the slices of the object to be scanned in the excitaton of the MRI scan, one or more parameters regarding the excitation bands (e.g., peak 1010 and peak 1020 shown in FIG. 10) used to excite the one or more slices, parameters regarding a slice selective gradient, or the like, or any combination thereof. Exemplary parameters regarding an excitation band may include a frequency range (e.g., from −3 kHz to 3 kHz), the magnitude of signals within the frequency range, or the like, or a combination thereof. In some embodiments, each of the one or more excitation bands may be used to excite a slice of the object in conjunction with a slice selective gradient. One or more slices may be excited based on the one or more excitation bands and a slice selective gradient. For instance, multiple slices of the object may be excited simultaneously based on multiple excitation bands and a slice selective gradient. In some embodiments, the designed time-domain waveform may be determined in advance and may be stored in a storage medium (e.g., the storage device 150, the storage 320). The waveform design module 510 may access the storage medium (e.g., the storage device 150, the storage 320) to obtain the designed time-domain waveform.

The control module 520 may be configured to direct an RFPA (e.g., the RFPA 207 in FIG. 2) of an MRI scanner (e.g., the MRI scanner 110) to generate an output RF pulse based on a time-domain waveform. In some embodiments, the control module 520 may direct the waveform generator 216 to generate an input RF pulse based on a time-domain waveform, and direct the waveform generator 216 to transmit output signals of the generated input RF pulse to the RFPA 207. The control module 520 may direct the RFPA 207 to amplify the input RF pulse (e.g., the power of the input RF pulse, the voltage of the input RF pulse) and generate an output RF pulse.

For example, the control module 520 may direct the waveform generator 216 and the RFPA 207 to generate an output RF pulse based on a designed time-domain waveform. See, e.g., FIG. 6 and the description thereof. As another example, the control module 520 may direct the waveform generator 216 and the RFPA 207 to generate an updated output RF pulse based on an updated time-domain waveform. See, e.g., FIG. 8 and the description thereof. As still another example, the control module 520 may direct the waveform generator 216 and the RFPA 207 to generate an excitation RF pulse based on a modified time-domain waveform. The excitation RF pulse may be applied to excite one or more slices of an object in conjunction with a slice selective gradient.

The output pulse acquisition module 530 may be configured to measure an output time-domain waveform of the output RF pulse generated by the RFPA (e.g., the RFPA 207). The output RF pulse generated by the RFPA 207 may be sent to the ADC 208. The ADC 208 may transform analog signals of the output RF pulse into digital signals of the output RF pulse. The digital signals of the output RF pulse may be sent to the output pulse acquisition module 530. The output pulse acquisition module 530 may collect the signals of the output RF pulse and measure the output time-domain waveform based on the collected signals of the output RF pulse. For example, the output pulse acquisition module 530 may measure an output time-domain waveform of an output RF pulse generated by the RFPA 207 based on the designed time-domain waveform. See, e.g., FIG. 6 and the description thereof. As another example, the output pulse acquisition module 530 may measure an output time-domain waveform of an updated RF pulse generated by the RFPA 207 based on an updated time-domain waveform. See, e.g., FIG. 8 and the description thereof.

Figure 9:
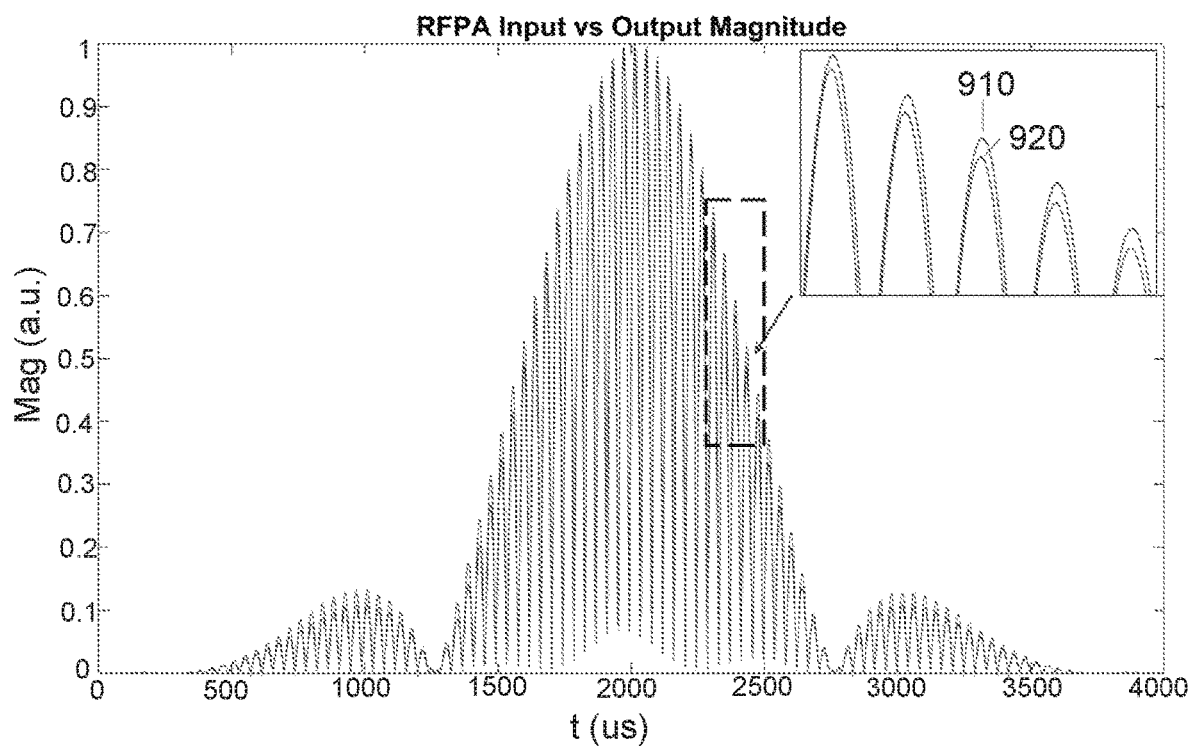
FIG. 9 shows an exemplary designed time-domain waveform and an exemplary corresponding output time-domain waveform according to some embodiments of the present disclosure.
Figure 10:
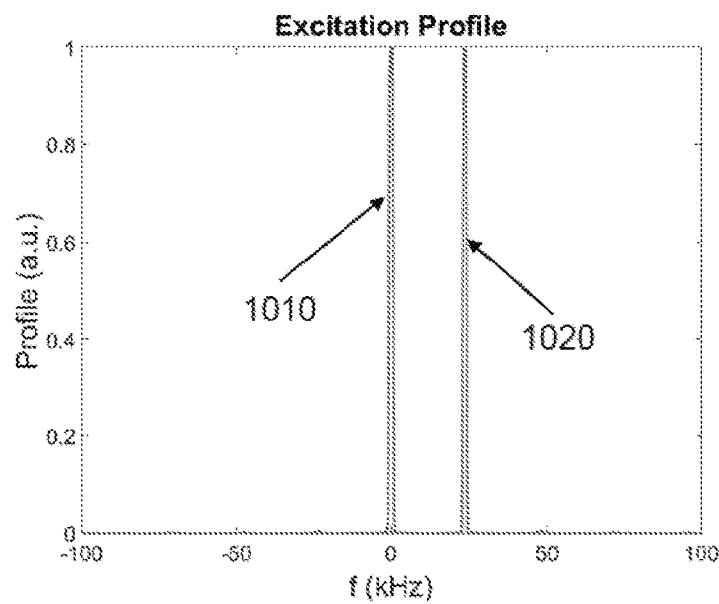
FIG. 10 shows an exemplary designed frequency-domain waveform according to some embodiments of the present disclosure.
Figure 11:
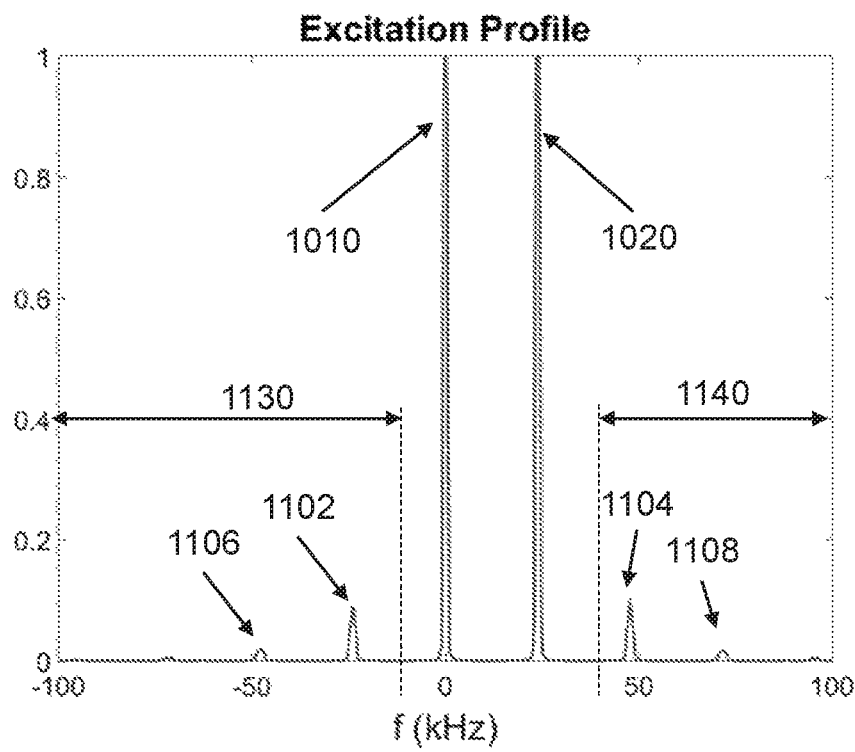
FIG. 11 shows an exemplary output frequency-domain waveform according to some embodiments of the present disclosure.

The waveform modification module 540 may be configured to determine a modified time-domain waveform corresponding to an excitation RF pulse based on the designed time-domain waveform and the output time-domain waveform. In general, an output RF pulse generated by the RFPA 207 based on the designed time-domain waveform may be applied to the RF coils 203 to generate an RF magnetic field to excite one or more slices of the object in conjunction with a slice selective gradient in an excitation in the MRI scan. However, the time-domain (or frequency-domain) waveform of the output RF pulse generated by the RFPA 207 based on the designed time-domain waveform may be different from the designed time-domain (or frequency-domain) waveform, which may be referred to as distortion. For example, as shown in FIG. 9, magnitude 910 of the output time-domain waveform corresponding to a time point is larger than and/or different from magnitude 920 of the designed time-domain waveform corresponding to the same time point. The distortion may lead to one or more sidebands (also referred to as frequency-domain sidebands) in a frequency-domain waveform of the output RF pulse, different from the frequency-domain waveform corresponding to the designed time-domain waveform (e.g., a designed frequency-domain waveform). A frequency-domain waveform may illustrate a relationship between a frequency and the magnitude/phase of an RF pulse. A sideband may correspond to excitation frequencies different from any designed excitation bands. The sideband may excite an undesired slice (e.g., a slice different from the one or more slices intended to be excited in an excitation) of the object, which may cause artifacts in an image generated based on the MRI scan. For example, as shown in FIG. 10, in the frequency-domain waveform corresponding to the designed time-domain waveform, there are only two excitation bands (e.g., peak 1010 and peak 1020) that are used to excite two slices of the object. As shown in FIG. 11, in the frequency-domain waveform of the output RF pulse, besides the two excitation bands (e.g., peak 1010 and peak 1020), there are sidebands (e.g., peak 1102, peak 1104, peak 1106, peak 1108). Therefore, the waveform modification module 540 may correct the designed time-domain waveform to eliminate or reduce the sideband(s) in the frequency-domain waveform of the output RF pulse. Description regarding the modification of the designed time-domain waveform may be found elsewhere in the present disclosure. See, e.g., FIG. 7 and FIG. 8, and the description thereof.

In some embodiments, the modified time-domain waveform may correspond to a desired excitation profile. The desired excitation profile may refer to a frequency-domain waveform of an output RF pulse generated by the RFPA 207 based on an RF pulse with the modified time-domain waveform. In some embodiments, compared to the designed frequency-domain waveform, no visible sidebands or sidebands whose magnitude exceeds a threshold is present in the desired excitation profile.

During the excitation in the MRI scan, an excitation RF pulse may be generated using the waveform generator 216 and the RFPA 207 based on the modified time-domain waveform, and the excitation RF pulse may be applied to the RF coils 203 to generate an RF magnetic field that is imposed to the object to excite the one or more slices in conjunction with a slice selective gradient.

The modules in the processing device 140 may be connected to or communicate with each other via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth, a ZigBee, a Near Field Communication (NFC), or the like, or any combination thereof. Two or more of the modules may be combined as a single module, and any one of the modules may be divided to two or more units. For example, the waveform design module 510 may be integrated into the output pulse acquisition module 530 as a single module that may both obtain a designed time-domain waveform, and determine an output time-domain waveform. As another example, the waveform design module 510 may be divided into two units. The first unit may be configured to obtain user specifications input by a user. The second unit may be configured to obtain a designed time-domain waveform based on the user specifications.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the processing device 140 may further include a storage module (not shown in FIG. 5). The storage module may be configured to store data generated during any process performed by any component of in the processing device 140. As another example, each of components of the processing device 140 may include a storage apparatus. Additionally or alternatively, the components of the computing device 120 may share a common storage apparatus.

Figure 6:
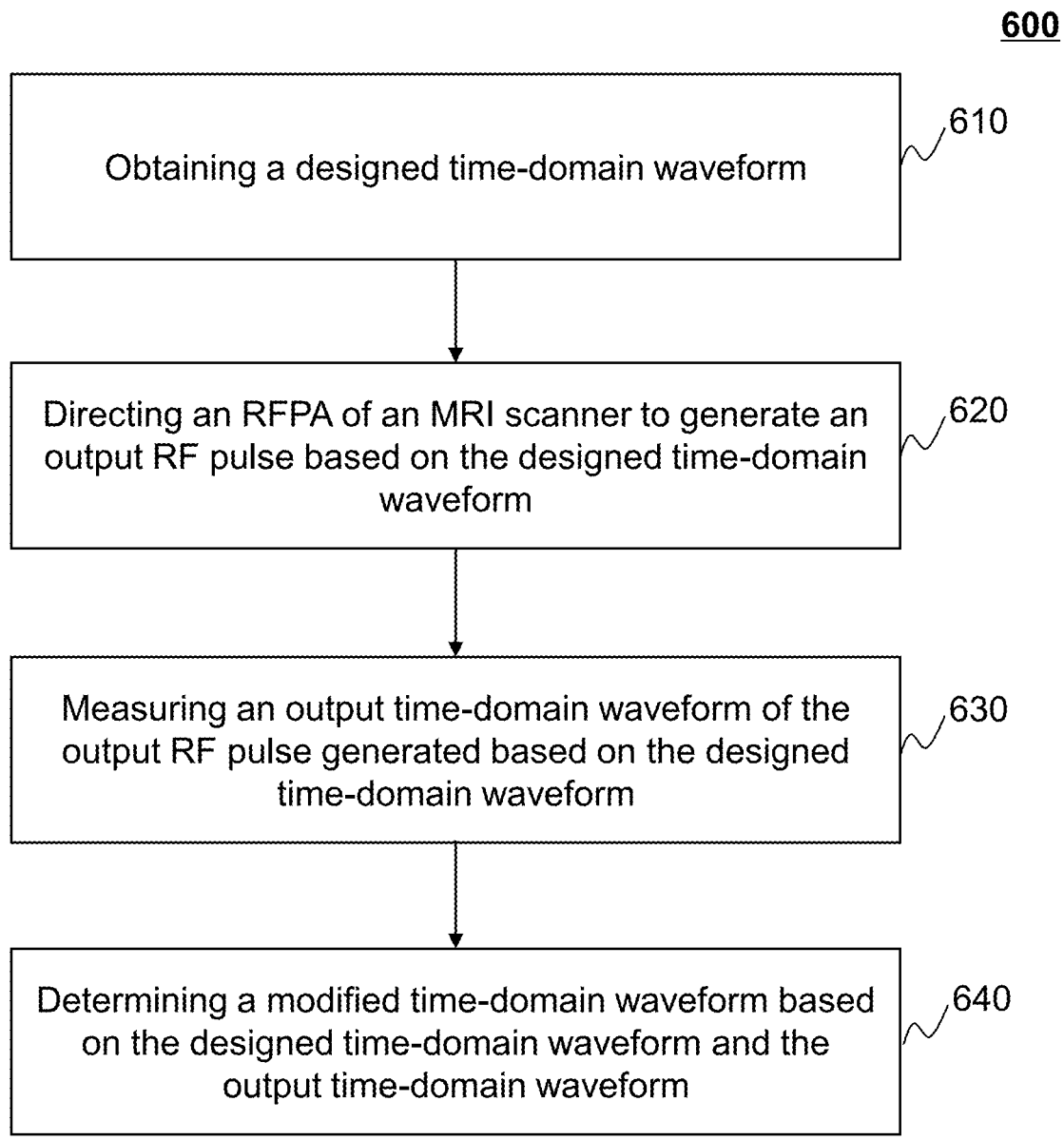
FIG. 6 is a flowchart illustrating an exemplary process for modifying a time-domain waveform according to some embodiments of the present disclosure.

FIG. 6 is a flowchart illustrating an exemplary process for modifying a time-domain waveform according to some embodiments of the present disclosure. The process 600 may be implemented in the MRI system 100 illustrated in FIG. 1. For example, the process 600 may be stored in the storage device 150 and/or the storage 320 in the form of instructions (e.g., an application), and invoked and/or executed by the processing device 140 (e.g., the processor 310 illustrated in FIG. 3, or one or more modules in the processing device 140 illustrated in FIG. 5). The operations of the illustrated process presented below are intended to be illustrative. In some embodiments, the process 600 may be accomplished with one or more additional operations not described, and/or without one or more of the operations discussed. Additionally, the order in which the operations of the process 600 as illustrated in FIG. 6 and described below is not intended to be limiting.

During an MRI scan, there may be one or more excitations in each of which one or more slices of an object may be excited. In an excitation, an excitation RF pulse may be applied to excite one or more slices of the object in conjunction with a slice selective gradient. The excitation RF pulse and the slice selective gradient may collaboratively determine which slice(s) of the object is/are excited. A slice of the object refers to a cross-section of the object. The cross-section may be parallel to a plane of any direction, such as a transverse plane, a sagittal plane, or a coronal plane of the object.

In 610, the waveform design module 510 may obtain a designed time-domain waveform. A time-domain waveform may be a scanning sequence illustrating a relationship between the time and the magnitude/phase of an RF pulse. In some embodiments, a user (e.g., a doctor, or an imaging engineer) of the MRI system 100 may input, through an interface of the processing device 140, user specifications. The waveform design module 510 may obtain the designed time-domain waveform according to the user specifications. The user specifications may include the number of slices of the object to be scanned in an excitaton of an MRI scan, the locations of the slices of the object to be scanned in the excitaton of the MRI scan, parameters regarding one or more excitation bands (e.g., peak 1010 and peak 1020 shown in FIG. 10) used to excite the one or more slices, parameters regarding a slice selective gradient, or the like, or any combination thereof. Exemplary parameters of an excitation band may include a frequency range (e.g., from −3 kHz to 3 kHz), the magnitude of signals within the frequency range, or the like, or a combination thereof. In some embodiments, each of the one or more excitation bands may be used to excite a slice of the object in conjunction with a slice selective gradient. One or more slices may be excited based on the one or more excitation bands and a slice selective gradient. For instance, multiple slices of the object may be excited simultaneously based on multiple excitation bands and a slice selective gradient. In some embodiments, the designed time-domain waveform may be determined in advance and may be stored in a storage medium (e.g., the storage device 150, the storage 320). The waveform design module 510 may retrieve the designed time-domain waveform from the storage medium (e.g., the storage device 150, the storage 320).

In 620, the control module 520 may direct an RFPA (e.g., the RFPA 207 in FIG. 2) of an MRI scanner (e.g., the MRI scanner 110) to generate an output RF pulse based on a time-domain waveform (e.g., the initially designed waveform or the corrected waveform). In some embodiments, the control module 520 may direct the waveform generator 216 to generate an input RF pulse based on the designed time-domain waveform, and direct the waveform generator 216 to transmit output signals of the generated input RF pulse to the RFPA 207. The control module 520 may direct the RFPA 207 to amplify the input RF pulse (e.g., the power of the input RF pulse, the voltage of the input RF pulse) and generate an output RF pulse.

In 630, the output pulse acquisition module 530 may measure an output time-domain waveform of the output RF pulse generated by the RFPA (e.g., the RFPA 207) based on the time-domain waveform (e.g., the initially designed waveform or the corrected waveform). The output RF pulse generated by the RFPA 207 may be sent to the ADC 208. The ADC 208 may transform analog signals of the output RF pulse into digital signals of the output RF pulse. The digital signals of the output RF pulse may be sent to the output pulse acquisition module 530. The output pulse acquisition module 530 may collect the signals of the output RF pulse and measure the output time-domain waveform based on the collected signals of the output RF pulse.

In 640, the waveform modification module 540 may determine a modified time-domain waveform based on the designed time-domain waveform and the output time-domain waveform. In general, an output RF pulse generated by the RFPA 207 based on the designed time-domain waveform may be applied to the RF coils 203 to generate an RF magnetic field to excite one or more slices of the object in conjunction with a slice selective gradient in an excitation in the MRI scan. However, the time-domain (or frequency-domain) waveform of the output RF pulse generated by the RFPA 207 based on the designed time-domain waveform may be different from the designed time-domain (or frequency-domain) waveform, which may be referred to as distortion. For example, as shown in FIG. 9, magnitude 910 of the output time-domain waveform corresponding to a time point is larger than and/or different from magnitude 920 of the designed time-domain waveform corresponding to the same time point. The distortion may lead to one or more sidebands (also referred to as frequency-domain sidebands) in a frequency-domain waveform of the output RF pulse, different from the frequency-domain waveform corresponding to the designed time-domain waveform (e.g., a designed frequency-domain waveform). A sideband may correspond to excitation frequencies different from any designed excitation bands. The sideband may excite an undesired slice (e.g., a slice different from the one or more slices intended to be excited in an excitation) of the object, which may cause artifacts in an image generated based on the MRI scan. For example, as shown in FIG. 10, in the frequency-domain waveform corresponding to the designed time-domain waveform (e.g., a designed frequency-domain waveform), there are only two excitation bands (e.g., peak 1010 and peak 1020) that are used to excite two slices of the object. As shown in FIG. 11, in the frequency-domain waveform of the output RF pulse, besides the two excitation bands (e.g., peak 1010 and peak 1020), there are sidebands (e.g., peak 1102, peak 1104, peak 1106, peak 1108). Therefore, the waveform modification module 540 may correct the designed time-domain waveform to eliminate or reduce the sideband(s) in the frequency-domain waveform of the output RF pulse. Description regarding the modification of the designed time-domain waveform may be found elsewhere in the present disclosure. See, e.g., FIG. 7 and FIG. 8, and the description thereof.

In some embodiments, the modified time-domain waveform may correspond to a desired excitation profile. The desired excitation profile may refer to a frequency-domain waveform of an output RF pulse generated by the RFPA 207 based on the modified time-domain waveform. In some embodiments, compared to the frequency-domain waveform corresponding to the designed time-domain waveform (e.g., a designed frequency-domain waveform), no visible sidebands or sidebands whose magnitude exceeds a threshold is present in the desired excitation profile.

During the excitation in the MRI scan, an excitation RF pulse may be generated using the waveform generator 216 and the RFPA 207 based on the modified time-domain waveform, and the excitation RF pulse may be applied to the RF coils 203 to generate an RF magnetic field to excite one or more slices of the object in conjunction with a slice selective gradient.

It should be noted that the above description of the process for determining the modified time-domain waveform is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure.

Figure 7:
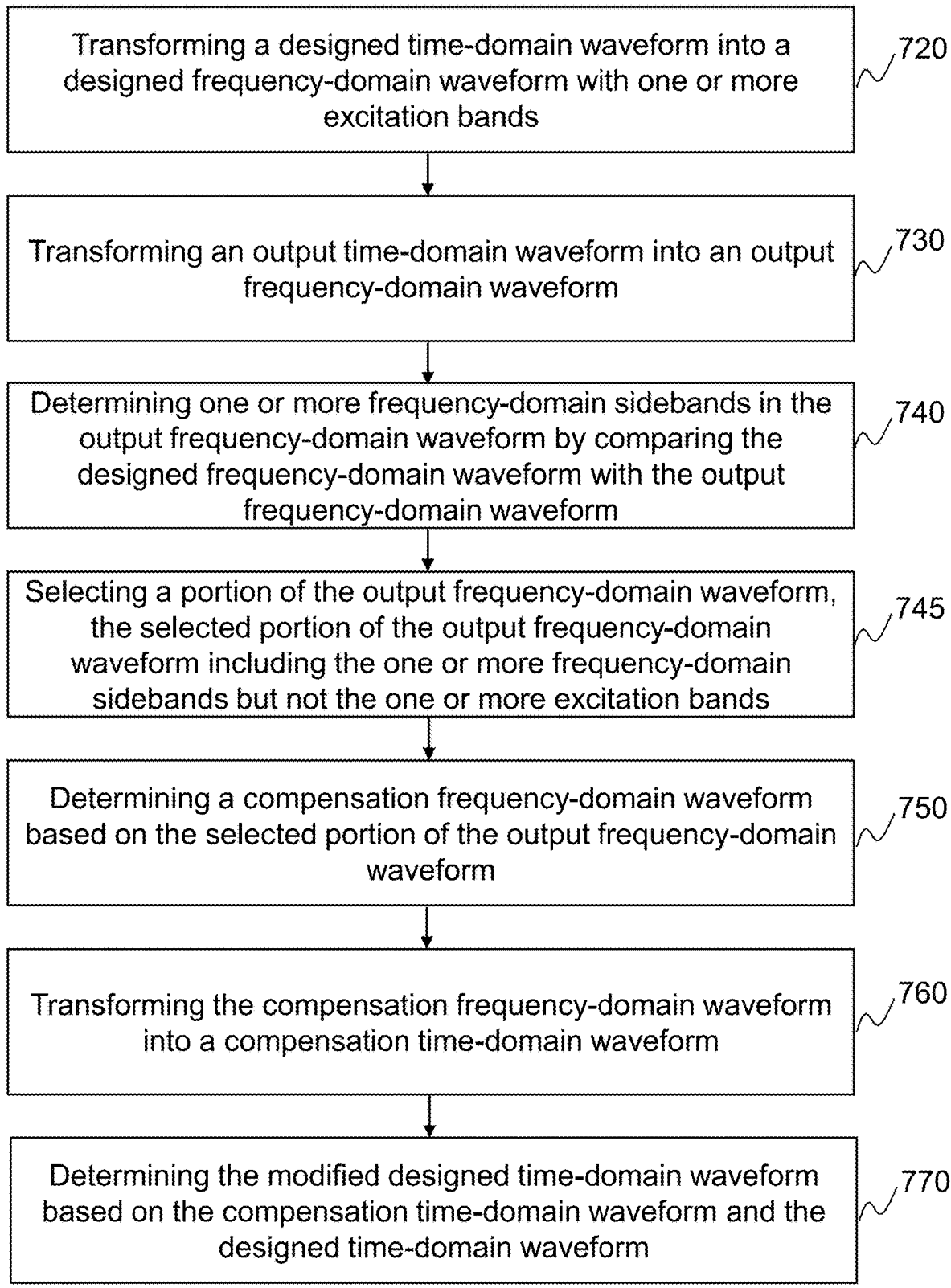
FIG. 7 is a flowchart illustrating an exemplary process for determining a modified time-domain waveform according to some embodiments of the present disclosure.

FIG. 7 is a flowchart illustrating an exemplary process for determining a modified time-domain waveform according to some embodiments of the present disclosure. The process 700 may be implemented in the MRI system 100 illustrated in FIG. 1. For example, the process 700 may be stored in the storage device 150 and/or the storage 320 in the form of instructions (e.g., an application), and invoked and/or executed by the processing device 140 (e.g., the processor 310 illustrated in FIG. 3, or one or more modules in the processing device 140 illustrated in FIG. 5). The operations of the illustrated process presented below are intended to be illustrative. In some embodiments, the process 700 may be accomplished with one or more additional operations not described, and/or without one or more of the operations discussed. Additionally, the order in which the operations of the process 700 as illustrated in FIG. 7 and described below is not intended to be limiting. In some embodiments, operation 640 illustrated in FIG. 6 may be performed according to the process 700.

In 720, the waveform modification module 540 may transform a designed time-domain waveform into a designed frequency-domain waveform with one or more excitation bands. In some embodiments, the waveform modification module 540 may transform the designed time-domain waveform into the designed frequency-domain waveform by Fourier transform.

In 730, the waveform modification module 540 may transform an output time-domain waveform into an output frequency-domain waveform. In some embodiments, the waveform modification module 540 may transform the output time-domain waveform into the output frequency-domain waveform by Fourier transform.

In 740, the waveform modification module 540 may determine one or more sidebands (also referred to as frequency-domain sidebands) in the output frequency-domain waveform by comparing the designed frequency-domain waveform with the output frequency-domain waveform. As used herein, a frequency-domain sideband may refer to undesired excitation in the frequency-domain representation of the RFPA output signal compared with the designed frequency-domain waveform profile. In some embodiments, the designed frequency-domain waveform may include one or more excitation bands (e.g., peak 1010 and/or peak 1020 in FIG. 10) that are used to excite one or more slices of the object in an excitation. The output frequency-domain waveform may include the one or more excitation bands (e.g., peak 1010 and/or peak 1020 in FIG. 11) corresponding to the one or more excitation bands in the designed frequency-domain waveform, and one or more sidebands (e.g., peak 1102, peak 1104, peak 1106, or peak 1108 in FIG. 11).

In 745, the waveform modification module 540 may select a portion (e.g., 1130 and/or 1140 in FIG. 11) of the output frequency-domain waveform. The selected portion of the output frequency-domain waveform may include the one or more frequency-domain sidebands but not the one or more excitation bands.

In 750, the waveform modification module 540 may determine a compensation frequency-domain waveform based on the selected portion of the output frequency-domain waveform. A phase difference between the compensation frequency-domain waveform and the selected portion of the output frequency-domain waveform may be 180°. The waveform modification module 540 may determine the compensation frequency-domain waveform by reversing the phase of the selected portion of the output frequency-domain waveform.

As used herein, a compensation frequency-domain waveform may partially or completely cancel out the one or more frequency-domain sidebands present in the output frequency-domain waveform.

In 760, the waveform modification module 540 may transform the compensation frequency-domain waveform into a compensation time-domain waveform. In some embodiments, the waveform modification module 540 may transform the compensation frequency-domain waveform into the compensation time-domain waveform by inverse Fourier transform.

In 770, the waveform modification module 540 may determine a modified time-domain waveform based on the compensation time-domain waveform and the designed time-domain waveform. In some embodiments, the waveform modification module 540 may combine the designed time-domain waveform with the compensation time-domain waveform to generate the modified time-domain waveform.

In some embodiments, to compensate the one or more sidebands in the output frequency-domain waveform, the waveform modification module 540 may determine one or more compensation frequency-domain sidebands corresponding to the one or more sidebands in the output frequency-domain waveform. A phase difference between a sideband in the output frequency-domain waveform and the corresponding compensation frequency-domain sideband may be 180°. As used herein, a compensation frequency-domain sideband may partially or completely cancel out the corresponding sideband present in the output frequency-domain waveform.

The waveform modification module 540 may transform the one or more compensation frequency-domain sidebands to the time domain by Fourier transform. The waveform modification module 540 may determine the modified time-domain waveform based on the designed time-domain waveform and the representation of the one or more compensation frequency-domain sidebands in the time domain.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the waveform modification module 540 may perform 720 and 730 in any order. For example, the waveform modification module 540 may perform 720 before or after 730. As another example, the waveform modification module 540 may perform 720 and 730 simultaneously.

Figure 8:
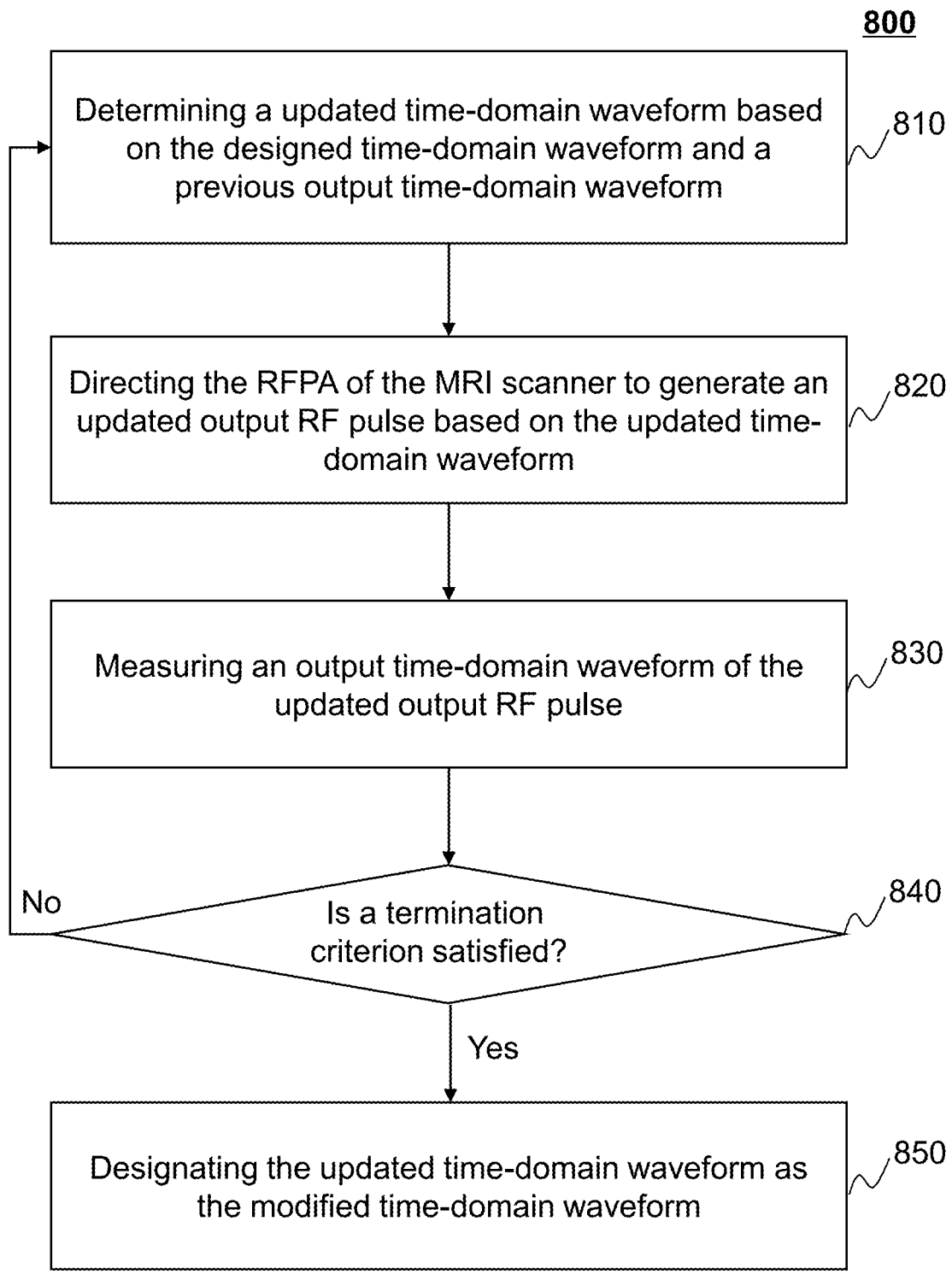
FIG. 8 is a flowchart illustrating an exemplary process for determining a modified time-domain waveform according to some embodiments of the present disclosure.

FIG. 8 is a flowchart illustrating an exemplary process for determining a modified time-domain waveform according to some embodiments of the present disclosure. The process 800 may be implemented in the MRI system 100 illustrated in FIG. 1. For example, the process 800 may be stored in the storage device 150 and/or the storage 320 in the form of instructions (e.g., an application), and invoked and/or executed by the processing device 140 (e.g., the processor 310 illustrated in FIG. 3, or one or more modules in the processing device 140 illustrated in FIG. 5). The operations of the illustrated process presented below are intended to be illustrative. In some embodiments, the process 800 may be accomplished with one or more additional operations not described, and/or without one or more of the operations discussed. Additionally, the order in which the operations of the process 800 as illustrated in FIG. 8 and described below is not intended to be limiting. In some embodiments, operation 640 illustrated in FIG. 6 may be performed according to the process 800.

In some embodiments, the waveform modification module 540 may repeatedly update the corrected time-domain determined in 640 of FIG. 6 in an iteration process including a plurality of iterations (e.g., each iteration may include operations 810-840), until satisfying a termination criterion. For instance, an iteration process including one or more iterations (e.g., each iteration may include operations 810-840) may be performed for determining a modified time-domain waveform.

In 810, the waveform modification module 540 may determine an updated time-domain waveform based on the designed time-domain waveform and a previous output time-domain waveform. The previous output time-domain waveform may correspond to an output RF pulse generated by the RFPA 207 based on the designed time-domain waveform in a first iteration or an output RF pulse generated by the RFPA 207 based on a previously updated time-domain waveform determined in a previous iteration. In some embodiments, the waveform modification module 540 may determine the updated time-domain waveform based on the process 700 described in FIG. 7.

For example, the waveform modification module 540 may transform the previous output time-domain waveform into a previous output frequency-domain waveform. The waveform modification module 540 may determine one or more sidebands (also referred to as frequency-domain sidebands) in the previous output frequency-domain waveform by comparing the designed frequency-domain waveform with the previous output frequency-domain waveform. The waveform modification module 540 may select a portion (e.g., 1130 and/or 1140 in FIG. 11) of the previous output frequency-domain waveform. The waveform modification module 540 may determine a compensation frequency-domain waveform based on the selected portion. A phase difference between the compensation frequency-domain waveform and the selected portion may be 180°. The waveform modification module 540 may determine the compensation frequency-domain waveform by reversing the phase of the selected portion of the previous output frequency-domain waveform. The waveform modification module 540 may transform the compensation frequency-domain waveform into a compensation time-domain waveform. The waveform modification module 540 may determine an updated time-domain waveform based on the compensation time-domain waveform and the previous output time-domain waveform.

In 820, the control module 520 may direct the RFPA 207 to generate an updated output RF pulse based on the updated time-domain waveform. In some embodiments, the control module 520 may direct the waveform generator 216 to generate an input RF pulse based on the updated time-domain waveform, and direct the waveform generator 216 to transmit output signals of the generated input RF pulse to the RFPA 207. The control module 520 may direct the RFPA 207 to amplify the input RF pulse (e.g., the power of the input RF pulse, the voltage of the input RF pulse) and generate an updated output RF pulse.

In 830, the output pulse acquisition module 530 may measure an output time-domain waveform of the updated output RF pulse. The updated output RF pulse generated by the RFPA 207 may be sent to the ADC 208. The ADC 208 may transform analog signals of the updated output RF pulse into digital signals of the updated output RF pulse. The digital signals of the updated output RF pulse may be sent to the output pulse acquisition module 530. The output pulse acquisition module 530 may collect the signals of the updated output RF pulse and measure the output time-domain waveform based on the collected signals of the updated output RF pulse.

In 840, the waveform modification module 540 may determine whether a termination criterion is satisfied. In some embodiments, the termination criterion may relate to a desired iteration count, a desired output RF pulse, a desired (time-domain or frequency-domain) output waveform, or the like, or a combination thereof.

Merely by way of example, the termination criterion may relate to a desired iteration count. The waveform modification module 540 may determine whether an iteration count of the iterations that have been performed is equal to or greater than a first threshold (e.g., 3 iterations). In response to the determination that the iteration count is equal to or greater than the first threshold, the waveform modification module 540 may terminate the iteration process, and the process 800 may proceed to 850. In response to the determination that the iteration count is lower than the first threshold, the waveform modification module 540 may initiate a new iteration, and the process 800 may proceed to 810. The counting of the iterations that have been performed may be done automatically by the waveform modification module 540 without user intervention.

As another example, the termination criterion may relate to a desired output RF pulse or a desired output (time-domain or frequency-domain) waveform. In some embodiments, the decision to terminate the iteration process based on an output RF pulse or waveform may be performed automatically without user intervention. For instance, an output (time-domain or frequency-domain) waveform corresponding to an output RF pulse generated in an iteration may be analyzed automatically. On the basis of the result of the analysis, a decision may be made automatically by the waveform modification module 540 as to whether to termination the iteration process. In some embodiments, the output (time-domain or frequency-domain) waveform may be analyzed to determine whether it contains a sideband whose magnitude exceeds a threshold. The threshold may be provided by a user or determined by the system 100.

In some embodiments, the decision to terminate the iteration process based on an output RF pulse or waveform may be performed with user intervention. For instance, a frequency-domain waveform of the output RF pulse generated by the RFPA 207 based on the modified time-domain waveform determined in the current iteration may be displayed to a user. The user may be prompted or allowed to provide an instruction related to the modified time-domain waveform determined in the current iteration. The waveform modification module 540 may terminate the iteration process or initiate a new iteration of the iteration process based on the instruction. In some embodiments, when the waveform modification module 540 receives an instruction indicating that the frequency-domain waveform (or a difference between the designed frequency-domain (e.g., the designed frequency-domain described in 720 in FIG. 7) and the frequency-domain waveform of the output RF pulse generated by the RFPA 207 based on the modified time-domain waveform determined in the current iteration) of the output RF pulse generated by the RFPA 207 based on the modified time-domain waveform determined in the current iteration is acceptable, the waveform modification module 540 may terminate the iteration process. For instance, the user may decide, based on the display, that the frequency-domain waveform of the output RF pulse generated by the RFPA 207 based on the modified time-domain waveform determined in the current iteration is acceptable when no visible sidebands are present or the magnitudes of all sidebands are lower than a threshold. When the waveform modification module 540 receives an instruction indicating that the frequency-domain waveform (or a difference between the designed frequency-domain (e.g., the designed frequency-domain described in 720 in FIG. 7) and the frequency-domain waveform of the output RF pulse generated by the RFPA 207 based on the modified time-domain waveform determined in the current iteration) of the output RF pulse generated by the RFPA 207 based on the modified time-domain waveform determined in the current iteration is unacceptable, the waveform modification module 540 may initiate a new iteration of the iteration process.

As a further example, the termination criterion may relate to both a desired iteration count and a desired output RF pulse or a desired output (time-domain or frequency-domain) waveform. For instance, the termination criterion is that a certain number of iterations have been performed or that a desired output RF pulse or a desired output (time-domain or frequency-domain) waveform is obtained, whichever occurs earlier or later. The waveform modification module 540 may decide whether to termination the iteration process based on the termination criterion. The decision to terminate the iteration process based on an output RF pulse or waveform may be performed automatically without user intervention, or with user intervention.

In 850, the waveform modification module 540 may designate the updated time-domain waveform determined in the last iteration of the iteration process as the modified time-domain waveform corresponding to the excitation RF pulse.

It should be noted that the above description of the process for determining the modified time-domain waveform is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure.

EXAMPLES

The following examples are provided for illustration purposes and not intended to limit the scope of the present disclosure.

FIG. 9 shows an exemplary designed time-domain waveform and a corresponding output time-domain waveform according to some embodiments of the present disclosure. The output time-domain waveform may be generated by an RFPA based on the designed time-domain waveform. A time-domain waveform may be a scanning sequence illustrating a relationship between the time and the magnitude/phase of an RF pulse. The horizontal axis is time in microseconds, and the vertical axis is magnitude (e.g., a relative value) in arbitrary unit (a.u.). In some embodiments, because of the hardware infidelity, the designed time-domain waveform and the output time domain waveform may be different. As shown in FIG. 9, magnitude 910 of the output time-domain waveform corresponding to a time point is larger than and/or different from magnitude 920 of the designed time-domain waveform corresponding to the same time point.

FIG. 10 shows an exemplary designed frequency-domain waveform according to some embodiments of the present disclosure. A frequency-domain waveform may illustrate a relationship between a frequency and the magnitude/phase of an RF pulse. The horizontal axis is frequency in kHz, and the vertical axis is magnitude (e.g., a relative value) in a.u. The designed frequency-domain waveform corresponds to the designed time-domain waveform illustrated in FIG. 9. As shown in FIG. 10, the designed frequency-domain waveform may include two excitation bands (e.g., peak 1010, peak 1020) used to excite two slices of an object simultaneously in an excitation of an MRI scan.

FIG. 11 shows an exemplary output frequency-domain waveform according to some embodiments of the present disclosure. The horizontal axis is frequency in kHz, and the vertical axis is magnitude (e.g., a relative value) in a.u. The output frequency-domain waveform corresponds to the output time-domain waveform illustrated in FIG. 9. As shown in FIG. 11, the output frequency-domain waveform may include two excitation bands (e.g., peak 1010, peak 1020) and one or more sidebands (e.g., peak 1102, peak 1104, peak 1106, peak 1108). In some embodiments, the waveform modification module 540 may determine the one or more sidebands by comparing the designed frequency-domain waveform in FIG. 10 with the output frequency-domain waveform in FIG. 11. The waveform modification module 540 may determine the one or more sidebands by selecting, for example, section 1130 and/or section 1140 of the output frequency-domain waveform. Section 1130 and section 1140 may include the one or more sidebands (e.g., peak 1102, peak 1104, peak 1106, peak 1108) but not the two excitation bands (e.g., peak 1010, peak 1020).

Figure 12:
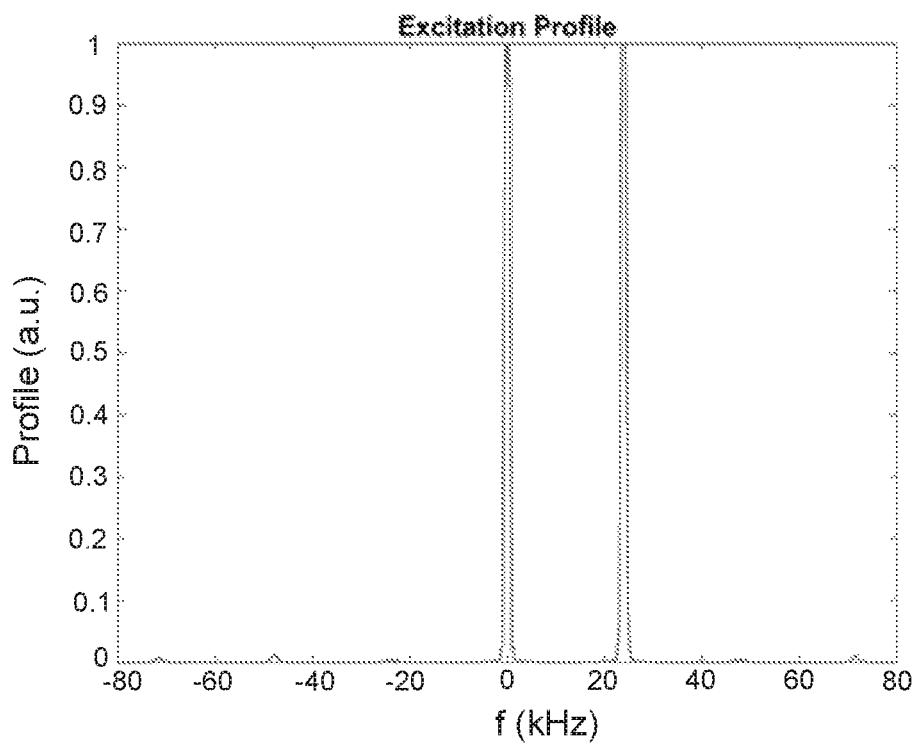
FIG. 12 shows an exemplary corrected output frequency-domain waveform according to some embodiments of the present disclosure.

FIG. 12 shows an exemplary corrected output frequency-domain waveform according to some embodiments of the present disclosure. A modified time-domain waveform may be determined by modifying the designed time-domain waveform illustrated in FIG. 9 using the methods (e.g., the process 600 illustrated in FIG. 6, the process 700 illustrated in FIG. 7, the process 800 illustrated in FIG. 8) described in the disclosure. The corrected output frequency-domain waveform may correspond to an output RF pulse generated by the RFPA 207 in FIG. 2 based on the modified time-domain waveform. As shown in FIG. 12, compared to the output frequency-domain waveform in FIG. 11 and the designed frequency-domain waveform in FIG. 10, sidebands in the corrected output frequency-domain waveform were reduced.

Figure 13:
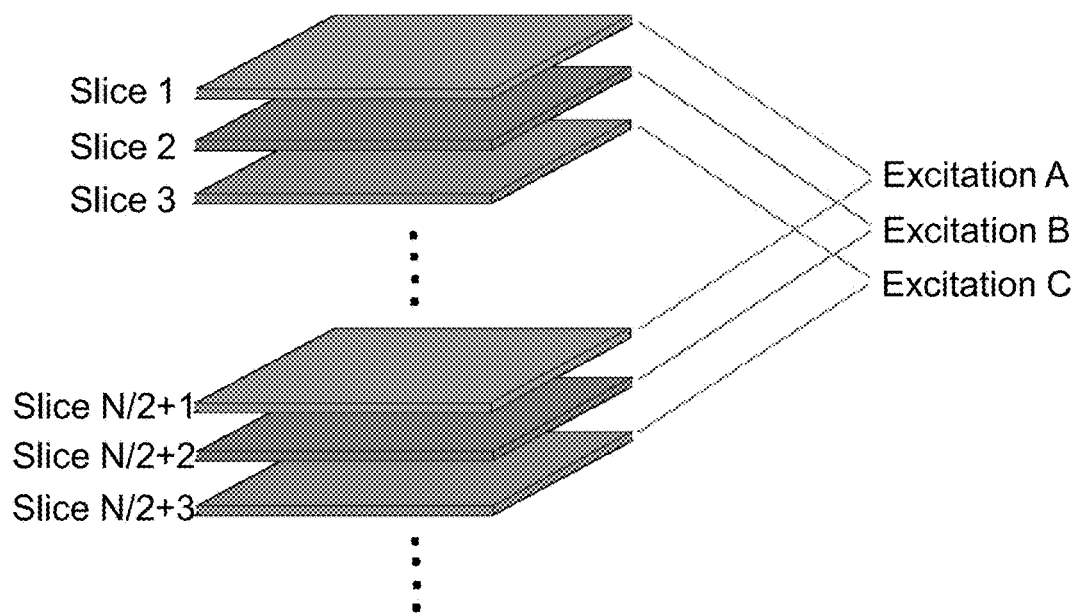
FIG. 13 is a schematic diagram illustrating an exemplary simultaneous multi-slice (SMS) imaging according to some embodiments of the present disclosure.

FIG. 13 is a schematic diagram illustrating an exemplary simultaneous multi-slice (SMS) imaging according to some embodiments of the present disclosure. Methods and systems described in the disclosure may be applied to SMS imaging. In SMS imaging, two or more slices may be excited simultaneously by an excitation RF pulse in an excitation. Merely by way of example, as shown in FIG. 13, N slices of an object need to be excited in an MRI scan. In one excitation, two slices may be excited simultaneously by an excitation pulse including two excitation bands. For example, in excitation A, slice 1 and slice N/2+1 may be excited simultaneously by a first excitation RF pulse. As another example, in excitation B, slice 2 and slice N/2+2 may be excited simultaneously by a second excitation RF pulse. As still another example, in excitation C, slice 3 and slice N/2+3 may be excited simultaneously by a third excitation RF pulse. Excitation A, excitation B, and excitation C may be performed one by one. Accordingly, the scan time may be halved compared to the way of exciting one slice in an excitation.

Figure 14:
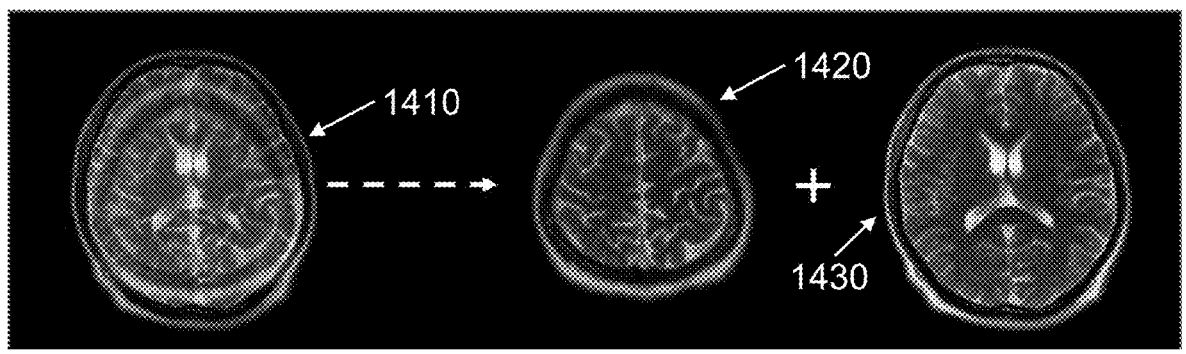
FIG. 14 is a schematic diagram illustrating exemplary image reconstruction in SMS imaging according to some embodiments of the present disclosure.

FIG. 14 is a schematic diagram illustrating exemplary image reconstruction in SMS imaging according to some embodiments of the present disclosure. As shown in FIG. 14, image 1410 includes aliasing artifacts related to two slices excited simultaneously in an excitation in SMS imaging. Multiple receiving coils with sufficient spatial encoding capabilities were used to separate the overlapping slices in image 1410. Image signals that were aliased into one pixel were separated by exploiting the sensitivity information inherent to the receiving coils. Exemplary reconstruction techniques may include sensitivity encoding (SENSE), Gene Relized Autocalibrating Partially Parallel Acquisitions (GRAPPA), or the like, or any combination thereof. Image 1420 shows a single slice separated from image 1410. Image 1430 shows a single slice separated from image 1410.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A non-transitory computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system, comprising:
one or more storage devices storing a set of instructions; and
one or more processors configured to communicate with the storage device, wherein when executing the set of instructions, the system is caused to:
obtain a designed time-domain waveform wherein the designed time-domain waveform is a scanning sequence;
direct a radio frequency power amplifier (RFPA) of a magnetic resonance imaging (MRI) scanner to generate an output RF pulse based on the designed time-domain waveform;
measure an output time-domain waveform of the output RF pulse;
determine, based on the designed time-domain waveform and the output time-domain waveform, a modified time-domain waveform corresponding to an excitation RF pulse wherein the modified time-domain waveform including a compensation time-domain waveform; and
direct the MRI scanner to generate, using a waveform generator and the RFPA and based on the modified time-domain waveform, the excitation RF pulse to excite one or more slices of an object in an MRI scan;
wherein to determine the modified time-domain waveform corresponding to the excitation RF pulse based on the designed time-domain waveform and the output time-domain waveform, the system is caused to:
transform the designed time-domain waveform into a designed frequency-domain waveform with one or more excitation bands;

transform the output time-domain waveform into the output frequency-domain waveform;
determine the one or more frequency-domain sidebands in the output frequency-domain waveform by comparing the designed frequency-domain waveform with the output frequency-domain waveform;
select a portion of the output frequency-domain waveform, the portion of the output frequency-domain waveform including the one or more frequency-domain sidebands but not the one or more excitation bands;
determine a compensation frequency-domain waveform based on the selected portion of the output frequency-domain waveform;
transform the compensation frequency-domain waveform into a compensation time-domain waveform; and
determine the modified time-domain waveform based on the compensation time-domain waveform and the designed time-domain waveform.

2. The system of claim 1, wherein the modified time-domain waveform is closer to satisfying an execution capability criterion than the designed time-domain waveform, the execution capability criterion embodying a criterion for a refocusing flip angle of the designed RF pulse.

3. The system of claim 1, wherein a phase difference between the selected portion of the output frequency-domain waveform and the compensation frequency-domain waveform is 180°.

4. The system of claim 1, wherein to determine the modified time-domain waveform corresponding to the excitation RF pulse, the system is caused to:
repeatedly determine an updated time-domain waveform in an iteration process including a plurality of successive iterations until a termination criterion is satisfied, wherein the updated time-domain waveform determined at the end of the iteration process is the modified time-domain waveform.

5. The system of claim 4, at least one of the plurality of iterations including:
determining the updated time-domain waveform based on the designed time-domain waveform and a previous output time-domain waveform, the previous time-domain waveform corresponding to the designed time-domain waveform in a first iteration of the iteration process or a previously updated time-domain waveform determined in a previous iteration, the updated time-domain waveform corresponding to an updated RF pulse;
directing the RFPA of the MRI scanner to generate the updated RF pulse; and
measuring an output time-domain waveform of the updated RF pulse.

6. The system of claim 5, wherein at feast one of the plurality of iterations further includes:
determining an iteration count of iterations that have been performed;
determining that the iteration count is equal to or greater than a first threshold; and
terminating, based on the determination that the iteration count is equal to or greater than the first threshold, the iteration process.

7. The system of claim 5, wherein at least one of the plurality of iterations further includes:
displaying, to a user, a frequency-domain waveform of an RF pulse generated by the RFPA based on the modified time-domain waveform updated in the at least one of the plurality of iterations;
receiving, from the user, an instruction related to the updated time-domain waveform determined in the at least one of the plurality of iterations; and
terminating, based on the received instruction, the iteration process.

8. The system of claim 7, wherein the received instruction includes that the updated RF pulse generated by the RFPA based on the updated time-domain waveform generated in the at least one of the plurality of iterations is acceptable.

9. A method implemented on a computing device having one or more processors and one or more storage devices, the method comprising:
obtaining a designed time-domain waveform wherein the designed time-domain waveform is a scanning sequence;
directing a radio frequency power amplifier (RFPA) of a magnetic resonance imaging (MRI) scanner to generate an output RF pulse based on the designed time-domain waveform;
measuring an output time-domain waveform of the output RF pulse;
determining, based on the designed time-domain waveform and the output time-domain waveform, a modified time-domain waveform corresponding to an excitation RF pulse wherein the modified time-domain waveform including a compensation time-domain waveform; and
directing the MRI scanner to generate, using a waveform generator and the RFPA and based on the modified time-domain waveform, the excitation RF pulse to excite one or more slices of an object in an MRI scan;
wherein determining the modified time-domain waveform corresponding to the excitation RF pulse based on the designed time-domain waveform and the output time-domain waveform comprises:
transforming the designed time-domain waveform into a designed frequency-domain waveform with one or more excitation bands;
transforming the output time-domain waveform into an output frequency-domain waveform;
determining one or more frequency-domain sidebands in the output frequency-domain waveform by comparing the designed frequency-domain waveform with the output frequency-domain waveform;
selecting a portion of the output frequency-domain waveform, the portion of the output frequency-domain waveform including the one or more frequency-domain sidebands but not the one or more excitation bands;
determining a compensation frequency-domain waveform based on the selected portion of the output frequency-domain waveform;
transforming the compensation frequency-domain waveform into a compensation time-domain waveform; and
determining the modified time-domain waveform based on the compensation time-domain waveform and the designed time-domain waveform.

10. The method of claim 9, wherein the modified time-domain waveform is closer to satisfying an execution capability criterion than the designed time-domain waveform, the execution capability criterion embodying a criterion for a refocusing flip angle of the designed RF pulse.

11. The method of claim 9, wherein a phase difference between the selected portion of the output frequency-domain waveform and the compensation frequency-domain waveform is 180°.

12. The method of claim 9, wherein determining the modified time-domain waveform corresponding to the excitation RF pulse comprises:

repeatedly determine an updated time-domain waveform in an iteration process including a plurality of successive iterations until a termination criterion is satisfied, wherein the updated time-domain waveform determined at the end of the iteration process is the modified time-domain waveform.

13. The method of claim 12, at least one of the plurality of iterations including:
   determining the updated time-domain waveform based on the designed time-domain waveform and a previous output time-domain waveform, the previous output time-domain waveform corresponding to the designed time-domain waveform in a first iteration of the iteration process or a previously updated time-domain waveform determined in a previous iteration, the updated time-domain waveform corresponding to an updated RF pulse;
   directing the RFPA of the MRI scanner to generate the updated RF pulse; and
   measuring an output time-domain waveform of the updated RF pulse.

14. The method of claim 13, wherein at least one of the plurality of iterations further includes:
   determining an iteration count of iterations that have been performed;
   determining that the iteration count is equal to or greater than a first threshold; and
   terminating, based on the determination that the iteration count is equal to or greater than the first threshold, the iteration process.

15. The method of claim 13, wherein at least one of the plurality of iterations further includes:
   displaying, to a user, a frequency-domain waveform of an RF pulse generated by the RFPA based on the modified time-domain waveform updated in the at least one of the plurality of iterations;
   receiving, from the user, an instruction related to the updated time-domain waveform determined in the at least one of the plurality of iterations; and
   terminating, based on the received instruction, the iteration process.

16. The method of claim 15, wherein the received instruction includes that the updated RF pulse generated by the RFPA based on the updated time-domain waveform generated in the at least one of the plurality of iterations is acceptable.

* * * * *